United States Patent

Matsui et al.

[11] Patent Number: 4,611,868
[45] Date of Patent: Sep. 16, 1986

[54] LEAD WIRE HOLDER

[75] Inventors: Kazuhiro Matsui, Toyoake; Hideo Wada; Yoshihito Nakano, both of Yokohama; Toshihiro Hayashi, Nagoya, all of Japan

[73] Assignee: Kitagawa Industries Co., Ltd., Nagoya, Japan

[21] Appl. No.: 681,127

[22] Filed: Dec. 13, 1984

[30] Foreign Application Priority Data

Dec. 16, 1983 [JP] Japan ................................. 58-238400

[51] Int. Cl.⁴ ............................................. H01R 11/00
[52] U.S. Cl. .............................. 339/59 M; 339/210 M
[58] Field of Search ................ 339/59 R, 59 M, 61 R, 339/61 M, 206 R, 206 P, 210 R, 210 M, 17 C

[56] References Cited

U.S. PATENT DOCUMENTS 3,680,035  7/1972  Teagno et al. .................... 339/59 M

FOREIGN PATENT DOCUMENTS 660068  6/1965  Belgium ........................... 339/210 R Primary Examiner—Gil Weidenfeld
Assistant Examiner—Paula A. Austin
Attorney, Agent, or Firm—Oblon, Fisher, Spivak, McClelland & Maier

[57] ABSTRACT

A lead wire holder including a first holding member and a second holding member. The first and second holding members are interconnected so that both can be folded and put together through a connecting portion. The holding members are provided on the inside thereof with opposed lead wire insertion recesses mounting legs for mounting the holder to a printed circuit board project downwardly from the lower end surface of either or both of the holding members. Elastic tongue portions for elastically holding lead wire are formed from a part of the wall portions of the lead wire insertion recesses. Narrow recesses are disposed on the lower end surface and extend from the insertion recesses, so that the insertion end of each lead wire is restricted when its coated end abuts against with the narrow portions. It is thereby possible to let downwardly projecting cores of the lead wires have a uniform projecting length.

11 Claims, 13 Drawing Figures

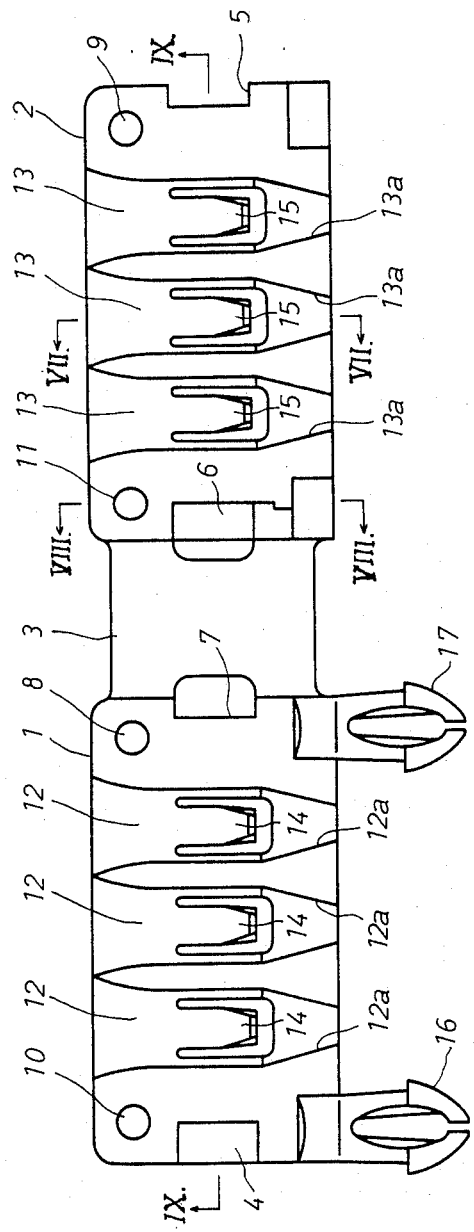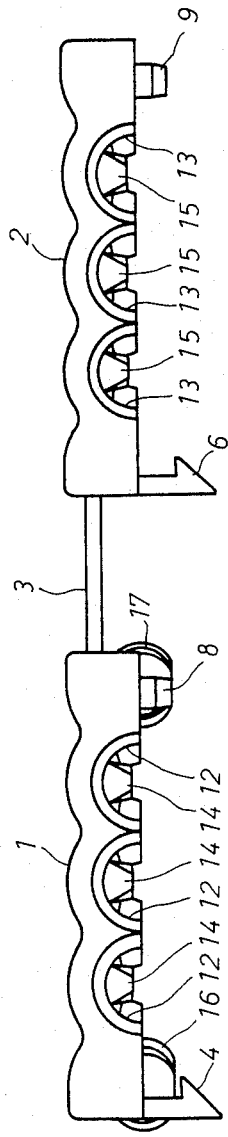
Fig. 2
Fig. 3

LEAD WIRE HOLDER

BACKGROUND OF THE INVENTION

1. Field of the Invention

The present invention relates to a lead wire holder for holding coated end portions of many lead wires when the lead wires are arranged and inserted in a printed circuit board.

2. Description of the Prior Art

A lead wire holder has been proposed in Japanese Utility Model Publication No. 46632/82 in which, when many lead wires are arranged and inserted in a printed circuit board, a coated end of each lead wire is held in place in a sandwiched fashion, and in this state the lead wires are fixed to the printed circuit board, thereby not only facilitating soldering of the lead wires to the same board but also protecting the lead wires as mounted after connection. This proposed lead wire holder has two holding pieces (i.e., two holding members) interconnected through a thin-walled portion, the holding pieces being each provided on its inside with recesses of a rectangular cross-section a little smaller in width than the lead wires, and both holding pieces are held with the lead wires inserted in the recesses and then retained in position by means of a retaining pawl, whereby the lead wires are held between both holding pieces.

Conventionally, in such a lead wire holder, however, the recesses around each lead wire have a lead wire insertion hole which is formed by joining the recesses, and the lead wire insertion hole has the same cross-sectional diameter at any portion thereof. Accordingly, the thickness of lead wires applicable to the conventional invention is limited, since a finer lead wire will come out of the holder and it is impossible to hold a thicker lead wire. What is necessary is to hold each lead wire for the core thereof to project properly from the bottom of the lead wire holder. In such a lead wire holder, the recesses have the same cross-sectional diameter—that is, there is no portion to retain a coated end of each lead wire. Therefore, each core projecting from the lead wire is different in length, or the coated ends of the lead wires may project from the bottom of the holder. Further, the above conventional lead wire holder is of a structure wherein the recesses are for holding a standard diameter of lead wires by the whole of the inner sides thereof, so the lead wire can not be inserted therein to be held in the recesses after the first holding piece is lapped over the second holding piece.

OBJECTS OF THE INVENTION

It is an object of the present invention to provide a lead wire holder which permits the enlargement of the applicable range of lead wire with respect to the diameter and the easy insertion of each lead wire to a certain position in the lead wire holder after the first holding piece has lapped over the second holding piece.

It is another object of the present invention to provide a lead wire holder applicable to lead wires of various diameters, capable of making uniform the projecting length wire cores by restricting the insertion ends of lead wires, and permitting easy insertion therein of lead wires and capable of holding lead wires firmly even after the holder has been put together.

SUMMARY OF THE INVENTION

The present invention comprises a first holding member and a second holding member including recesses extending on each of the inner sides of the first holding member and the second holding member. The first holding member is capable of being lapped over and interconnected to the second holding member through a connecting portion. Mounting legs project downwardly from either or both of the lower ends of the holding members for mounting the holder to a printed circuit board. An elastic tongue is provided on a wall portion of each recess for elastically holding each lead wire, and narrower recess being disposed on the lower end surface and extends from the recess.

BRIEF DESCRIPTION OF THE DRAWINGS

The accompanying drawings illustrate embodiments of the present invention, in which:

FIG. 2 is a front view thereof in a developed state;

FIG. 3 is a plan view thereof;

DESCRIPTION OF THE PREFERRED EMBODIMENTS

Figure 1:
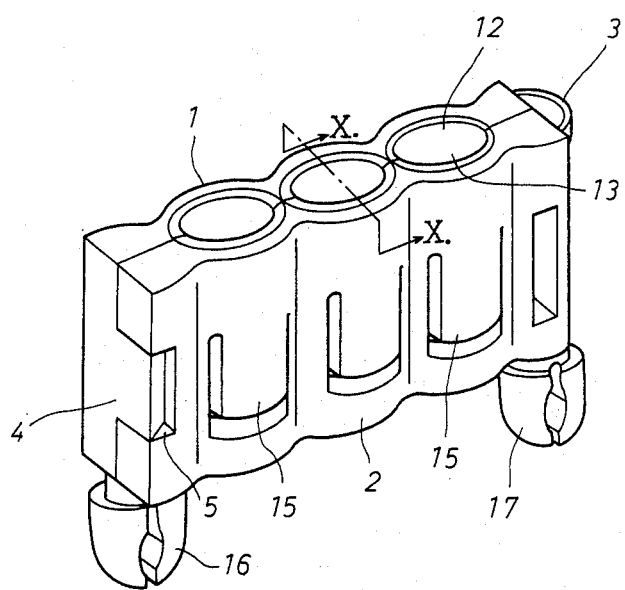
FIG. 1 is a perspective view of a first embodiment of a lead wire holder according to the invention.
Figure 4:
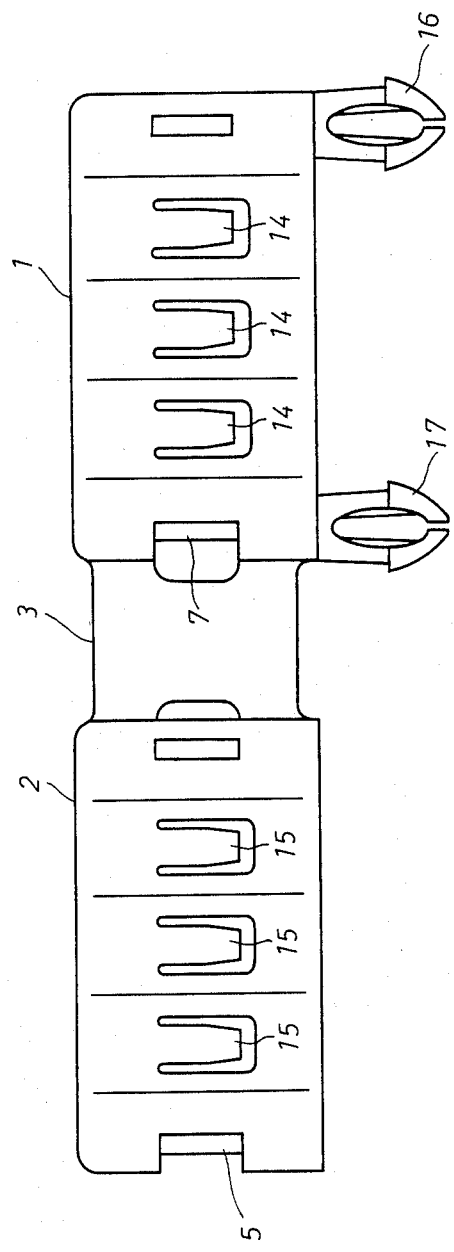
FIG. 4 is a rear view thereof.
Figure 5:
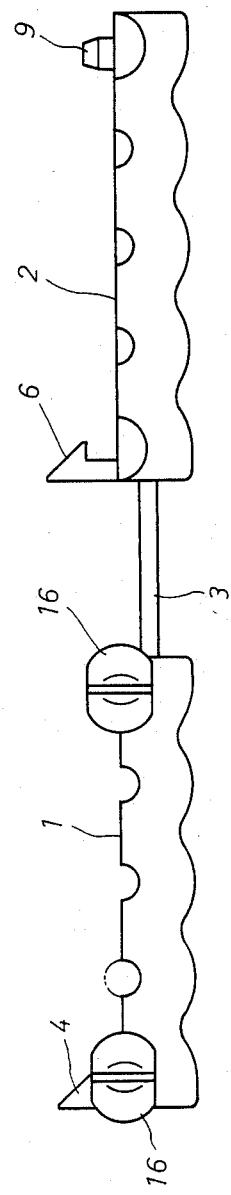
FIG. 5 is a bottom view thereof.
Figure 6:
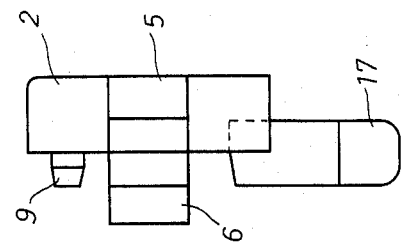
FIG. 6 is a right-hand side view thereof.

Embodiments of the present invention will be described hereinunder with reference to the drawings.

Referring first to FIGS. 1 to 6, there is illustrated a lead wire holder according to an embodiment of the present invention in which a first holding member 1 and a second holding member 2 of the lead wire holder are interconnected through a connecting portion 3 so that they can be folded by bending of the connecting portion 3. The first and second holding members 1 and 2 and the connecting portion 3 are integrally formed of a synthetic resin.

The numeral 4 denotes a retaining pawl projecting from the leftmost end of the inner surface of the first holding member 1. When both holding members are folded and put together, the retaining pawl 4 comes into engagement with a retaining recess 5 which is formed in the rightmost end of the inner surface of the second holding member 2.

The numeral 6 denotes a retaining pawl projecting from the rightmost end of the inner surface of the second holding member 2. When both holding members are folded and put together, the retaining pawl 6 comes into engagement with a retaining recess 7 formed in the rightmost end of the inner surface of the first holding member 1.

The numerals 8 and 9 denote engaging projections projecting from the rightmost upper portions of the inner surface of the holding members 1 and 2, respectively. When both holding members are folded and put together, the engaging projections 8 and 9 come into engagement with opposed engaging holes 10 and 11 formed in the leftmost upper portions of the inner surface of the holding members 2 and 1, respectively. On each inner surface of the holding members 1 and 2 are formed three lead wire holding insertion recesses 12 and 13, respectively. Each of the three recesses 12 is juxtaposed and is opposed to a corresponding one of the recesses 13.

The recesses (12, 13) of the first and the second holding members (1, 2) are respectively semi-circular in cross-section. One extension of each recess gradually increases in width, and the end of that extension opens on the first end surface (i.e., on the top end surface in FIGS. 1 and 2). Another extension of each recess gradually decreases in width and the end of that extension is a narrower recess (12a, 13a) disposed on the second end surface (i.e., on the bottom end surface in FIG. 2). Consequently, when the holding members 1 and 2 are in a folded state, on the end surfaces of the first and the second holding member, there are formed lead wire insertion holes by joining the opposing recesses 12 and 13. The insertion holes on the upper end surface are open wide, and the insertion holes on the lower end surface are open narrowly to an extent permitting lead wire cores to pass there through.

Figure 7:
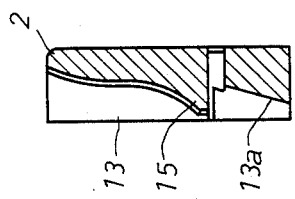
FIG. 7 is a sectional view taken on line VII—VII of FIG. 2.
Figure 8:
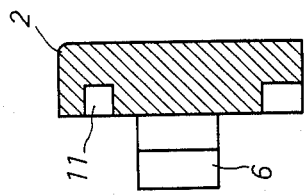
FIG. 8 is a sectional view taken on line VIII—VIII of FIG. 2.

At intermediate wall portions of the lead wire insertion recesses 12 and 13 are formed elastic tongue portions 14 and 15 respectively for holding inserted lead wires elastically. The tongue portions 14 and 15 are each formed by cutting a part of the wall portion in U shape so that the lower end portion projects inwardly as shown in FIG. 7.

The numerals 16 and 17 denote mounting legs projecting from the left and right lower portions of the holding member 1 for mounting the holder to a printed circuit board. The mounting legs 16 and 17 are each composed of two elastic leg pieces adapted to be elastically deformed when fitted in mounting holes formed in the printed circuit board for securing the holder to the printed circuit board.

Figure 9:
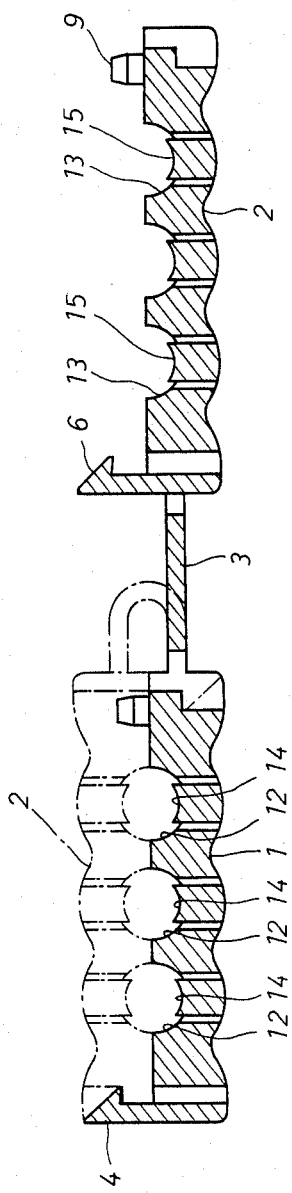
FIG. 9 is a sectional view taken on line IX—IX of FIG. 2.
Figure 10:
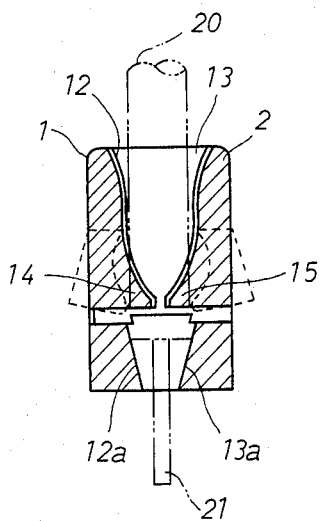
FIG. 10 is a sectional view taken on line X—X of FIG. 1.

In the lead wire holder thus constructed, as shown in FIG. 9, the holding members 1 and 2 is folded inwardly through the connecting portion 3 and put together. At the same time, the engaging projection 9 of the holding member 2 and the engaging projection 8 of the holding member 1 are fitted in the engaging hole 10 and 11 of the first and the second holding member 1 and 2, respectively. Further, the retaining pawl 6 of the holding member 2 and the retaining pawl 4 of the holding member 1 are engaged with the retaining hole 7 of the holding member 1 and the retaining hole 5 of the holding member 2, respectively. At this time, as shown in FIG. 10, if each lead wire 20 is inserted in the lead wire insertion recesses 12 and 13 and in this state the first holding member 1 is lapped over the second holding member, the coated surface of the lead wire 20 is supported with both side walls to the elastic tongue portions 14 and 15 and held therebetween. At the same time, the coated end abuts a part of the narrow recess 13a, whereby its insertion is restricted to a predetermined position while its core 21 projects downwardly (in FIG. 10) from a hole of a reduced diameter.

Figure 11:
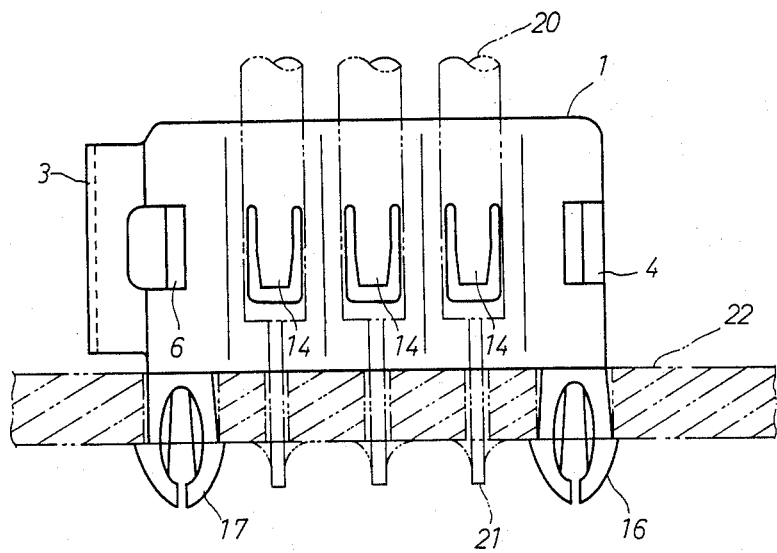
FIG. 11 is a front view of the lead wire holder as mounted on a printed circuit board.

FIG. 11 shows the lead wire holder holding each lead wire between the first holding member 1 and the second holding member. The mounting legs 16 and 17 are inserted and fitted in mounting holes in a printed circuit board 22, and the cores 21 which extend from the coated ends of the lead wires 20 are inserted in the insertion through holes of the printed circuit board 22.

The lead wire holder according to the present invention enable the holding of each lead wire merely by inserting it through the holes disposed on the first end surface of the holding member, thereby holding it in the right position after the first holding member is lapped over the second holding member and is mounted to the printed circuit board. A lead wire of the appropriate thickness may to be easily inserted into the widely opened insertion holes disposed on the first surface of the holder, and the coated end of the lead wire pushes and opens elastic tongues 14, 15 to insert itself till it stops near the narrower hole. In this state, the lead wire 20 is held firmly between the elastic tongue portions, and only its core 21 further projects downwardly and appears on the rear side of the printed circuit board 2. In case the lead wire is a thicker one, its coating end stops in the position of the elastic tongue portions 14 and 15, but even in this state the lead wire 20 is firmly held in place. Thus, the subject lead wire holder is applicable to lead wires of various diameters, ranging from a lead wire which is thick enough to be barely inserted from the upper opening of the holder up to a lead wire which is fine enough to be barely stopped near the narrower hole. The lead wires 20 are thus held in place on the printed circuit board by the lead wire holder. Each end of a projecting core can be soldered to the first surface of the printed circuit board by dipping or other suitable means, and still the lead wire is held securely in the holder.

Figure 12:
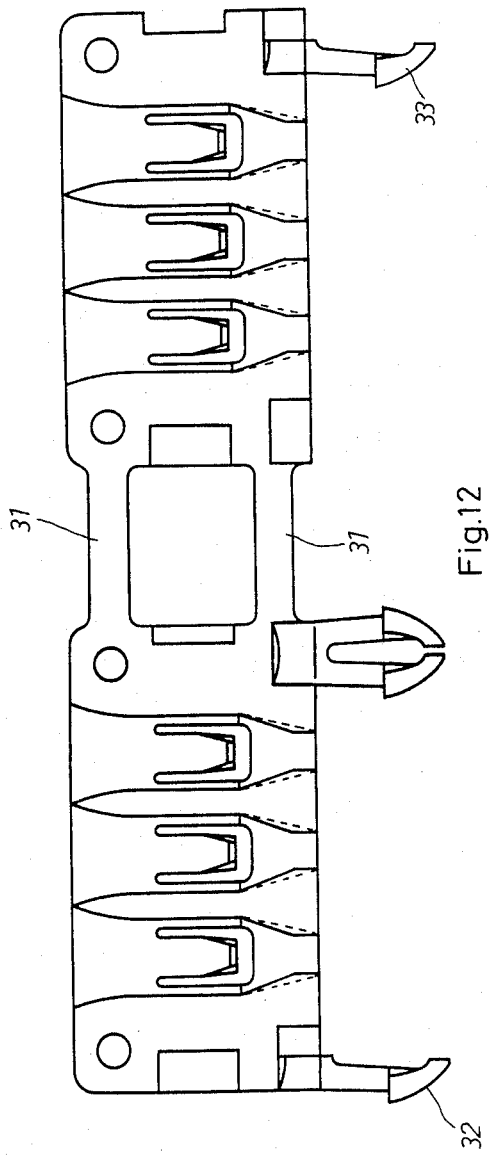
FIG. 12 is a front view in a developed state of a lead wire holder according to a second embodiment of the invention.

FIG. 12 is a front view of a lead wire holder according to a second embodiment of the present invention. In this embodiment the first and the second holding members are connected by two rigid connecting strips 31 horizontally extending from the upper part and the lower part of both side surfaces positioned side by side. The mounting leg 17 of the first embodiment is vertically divided into two parts so that one half mounting leg piece 32 is attached to the lower end surface of the first holding member 1, and the other half mounting leg piece 33 is attached to the lower end surface of the second holding member 2. According to this construction, both half mounting leg pieces 32 and 33 are fitted in a single mounting hole formed in the printed circuit board. Consequently it is possible to prevent the holding members 1 and 2 from being opened suddenly during use.

Figure 13:
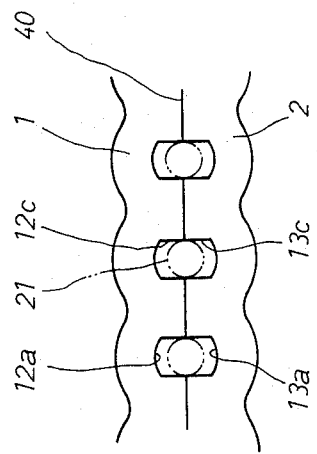
FIG. 13 is a bottom view showing a part of a lead wire holder according to a third embodiment of the invention.

FIG. 13 illustrates a third embodiment of the present invention. In this embodiment each of the narrower holes disposed on the bottom end surfaces is formed not as a circular-shape but as a rectangle having a first semi-circle at one side thereof and a second semi-circle at the opposite side thereof. Parallel recess-walls 12c and 13c are perpendicular to the boundary surface 40 between the holding members 1 and 2. According to this construction, upon insertion of the core 21 of each lead wire 20, the pressure from the core 21 is received by only the straight line recess walls 12c and 13c, so that the pressure acts in a direction parallel to the boundary surface 40 and does not act in a direction perpendicular to the boundary surface. Consequently, insertion of the cores 21 does not cause opening of the holding members 1 and 2.

According to the lead wire holder of the present invention, as set forth hereinabove, elastic tongue portions are provided in the lead wire insertion. Accordingly, even fine lead wires can be prevented from coming out of the holder and can be firmly held in place. Consequently, the holder is applicable to a wide range of lead wires of difference thicknesses. Besides, even in the folded state of the lead wire holder, each lead wire can be easily inserted to a predetermined position. Further, on the second surface of the lead wire holder are disposed narrower holes by joining the opposing recesses, and the end of each inserted lead wire can be restricted by abutting the coated end for making uniform the length projected from the second end surface.

What is claimed is:

1. A lead wire holder comprising:
   (a) a first holding member having an inside surface, an outside surface, a top surface, a bottom surface, a first end, and a second end;
   (b) a second holding member having an inside surface, an outside surface, a top surface, a bottom surface, a first end, and a second end,
   (c) a flexible hinge member joining the first end of said first holding member to the first end of said second holding member such that the inside surface of said first holding member can be brought into engagement with the inside surface of said second holding member;
   (d) at least one mounting leg formed on the bottom surface of one of said first holding member and said second holding member, said at least one mounting leg being adapted to mount the lead wire holder by insertion into a mounting hole;
   (e) a plurality of recesses formed in the inside surfaces of said first and second holding members and extending from the top to the bottom surfaces of said first and second holding members, said recesses being sized, shaped, and positioned so that, when the inside surface of said first holding member has been brought into engagement with the inside surface of said second holding member, each recess on said first holding member mates with a corresponding recess on said second holding member to form a through hole leading from the top surface of said first and second holding members to the bottom surfaces of said first and second holding members, said through holes having cross-sectional dimensions which decrease monotonically from the top surface of said first and second holding members to the bottom surfaces of said first and second holding members;
   (f) a plurality of elastic tongues formed in said first holding member, one of said plurality of elastic tongues projecting into each one of said plurality of through holes in position to resiliently engage and hold a lead wire inserted into said through hole; and
   (g) a plurality of elastic tongues formed in said second holding member, one of said plurality of elastic tongues projecting into each one of said plurality of through holes in position to resiliently engage and hold a lead wire inserted into said through hole, whereby coated lead wires of varying diameters can be inserted into said through holes from the top surfaces of said first and second holding members, the coatings on the coated lead wires will abut against the walls of the through holes at different points depending on the diameters of the lead wires, the lead wires will be held in said through holes by said elastic tongues, and the uncoated cores of the lead wires extend out from said through holes at the bottom surfaces of said first and second holding members.

2. A lead wire holder as recited in claim 1 wherein said through holes are circular in cross-section.

3. A lead wire holder as recited in claim 1 wherein:
   (a) each of said through holes has two opposed planar surfaces perpendicular to the inside surfaces of said first and second holding members adjacent to the bottom surfaces of said first and second holding members and
   (b) the two opposed planar surfaces of each of said through holes are spaced from each other by a distance such that, in use, the two opposed planar surfaces grip the uncoated core of the lead wire therebetween.

4. A lead wire holder as recited in claim 1 and further comprising:
   (a) at least one retaining pawl formed on the inside surface of one of said first and second holding members and
   (b) at least one retaining recess formed in the inside surface of the other one of said first and second holding members, said at least one retaining recess being sized, shaped, and positioned to receive said at least one retaining pawl and to hold the inside surface of said first holding member in engagement with the inside surface of said second holding member.

5. A lead wire holder as recited in claim 1 wherein each of said elastic tongues has the shape of a U formed by cutting a part of one of said holding members.

6. A lead wire holder as recited in claim 1 wherein said at least one mounting leg is composed of two parts, one of which is formed on each of said first and second holding members.

7. A lead wire holder comprising:
   (a) a first holding member having an inside surface, an outside surface, a top surface, a bottom surface, a first end, and a second end;
   (b) a second holding member having an inside surface, an outside surface, a top surface, a bottom surface, a first end, and a second end;
   (c) a flexible hinge member joining the first end of said first holding member to the first end of said second holding member such that the inside surface of said first holding member can be brought into engagement with the inside surface of said second holding member, said flexible hinge member comprising a first connecting strip extending from the top surface of said first holding member to the top surface of said second holding member and a second connecting strip extending from the bottom surface of said first holding member to the bottom surface of said second holding member;
   (d) at least one mounting leg formed on the bottom surface of one of said first holding member and said second holding member, said at least one mounting leg being composed of two parts, one of which is formed on each of said first and second holding members;
   (e) a plurality of recesses formed in the inside surface of said first and second holding members and extending from the top to the bottom surfaces of said first and second holding members, said recesses being sized, shaped, and positioned so that, when the inside surface of said first holding member has been brought into engagement with the inside surface of said second holding member, each recess on said first holding member mates with a corresponding recess on said second holding member to form a through hole leading from the top surface of said first and second holding members to the bottom surfaces of said first and second holding members;

(f) a plurality of elastic tongues formed in said first holding member, one of said plurality of elastic tongues projecting into each one of said plurality of through holes in position to resiliently engage and hold a lead wire inserted into said through hole; and (g) a plurality of elastic tongues formed in said second holding member, one of said plurality of elastic tongues projecting into each one of said plurality of through holes in position to resiliently engage and hold a lead wire inserted into said through hole, whereby coated lead wires can be inserted into said through holes from the top surfaces of said first and second holding members, the coatings on the coated lead wires will abut against the walls of the through holes, the lead wires will be held in said through holes by said elastic tongues, and the uncoated cores of the lead wires extend out from said through holes at the bottom surfaces of said first and second holding members.

8. A lead wire holder as recited in claim 7 wherein said through holes are circular in cross-section.

9. A lead wire holder as recited in claim 7 wherein:
(a) each of said through holes has two opposed planar surfaces perpendicular to the inside surfaces of said first and second holding members adjacent to the bottom surfaces of said first and second holding members and
(b) the two opposed planar surfaces of each of said through holes are spaced from each other by a distance such that, in use, the two opposed planar surfaces grip the uncoated core of a lead wire therebetween.

10. A lead wire holder as recited in claim 7 and further comprising:
(a) at least one retaining pawl formed on the inside surface of one of said first and second holding members and
(b) at least one retaining recess formed in the inside surface of the other one of said first and second holding members, said at least one retaining recess being sized, shaped, and positioned to receive said at least one retaining pawl and to hold the inside surface of said first holding member in engagement with the inside surface of said second holding member.

11. A lead wire holder as recited in claim 7 wherein each of said elastic tongues has the shape of a U formed by cutting a part of one of said holding members.

* * * * *